(12) United States Patent
Seki et al.

(10) Patent No.: US 7,294,960 B2
(45) Date of Patent: Nov. 13, 2007

(54) ORGANIC ELECTROLUMINESCENT DEVICE WITH HIL/HTL SPECIFIC TO EACH RGB PIXEL

(75) Inventors: Shunichi Seki, Suwa (JP); Masahiro Uchida, Chino (JP)

(73) Assignee: Seiko Epson Corporation (JP)

( * ) Notice: Subject to any disclaimer, the term of this patent is extended or adjusted under 35 U.S.C. 154(b) by 323 days.

(21) Appl. No.: 10/914,043

(22) Filed: Aug. 6, 2004

(65) Prior Publication Data

US 2005/0057148 A1 Mar. 17, 2005

(30) Foreign Application Priority Data

Aug. 8, 2003 (JP) ............................ 2003-290653

(51) Int. Cl.
*H01J 63/04* (2006.01)

(52) U.S. Cl. ...................... 313/504; 313/502; 313/505; 313/506; 428/690; 428/691

(58) Field of Classification Search ........ 313/498–503, 313/504–512; 315/169.1, 169.3; 428/690–691, 428/917

See application file for complete search history.

(56) References Cited

U.S. PATENT DOCUMENTS 5,652,067 A * 7/1997 Ito et al. ..................... 428/690

6,337,404 B1 * 1/2002 Han et al. ................... 548/440
2003/0137557 A1 * 7/2003 Nakamura ................... 347/44

FOREIGN PATENT DOCUMENTS

| JP | 2000-323276 | 11/2000 |
| JP | 2001-150152 | 6/2001 |
| JP | 2002-231447 | 8/2002 |
| JP | 2004-119201 | 4/2004 |

OTHER PUBLICATIONS

Communication from Japanese Patent Office regarding counterpart application.

* cited by examiner

*Primary Examiner*—Joseph Williams
*Assistant Examiner*—Hana Asmat Sanei
(74) *Attorney, Agent, or Firm*—Harness, Dickey & Pierce, P.L.C.

(57) ABSTRACT

An organic EL device comprises a plurality of organic EL elements, each of which has a pair of electrodes and functional layers including at least a light-emitting layer between the electrodes. With respect to components other than the light-emitting layer, the structure of the functional layer in one organic EL element among the organic EL elements is different from those of the functional layers in other organic EL elements.

17 Claims, 8 Drawing Sheets

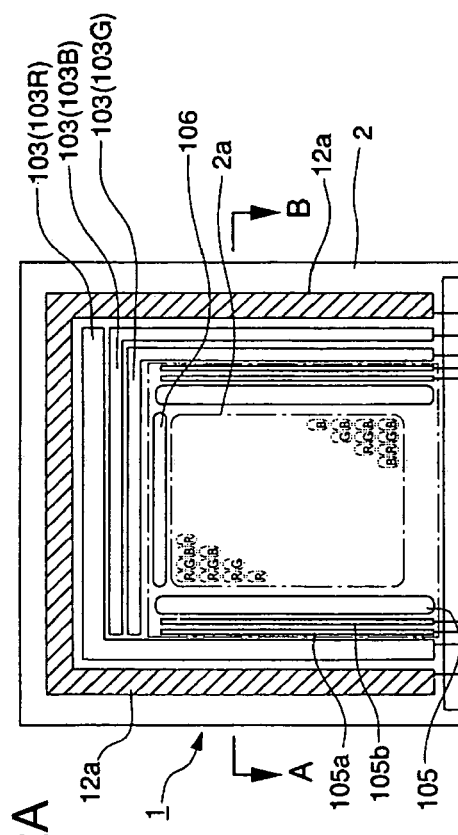
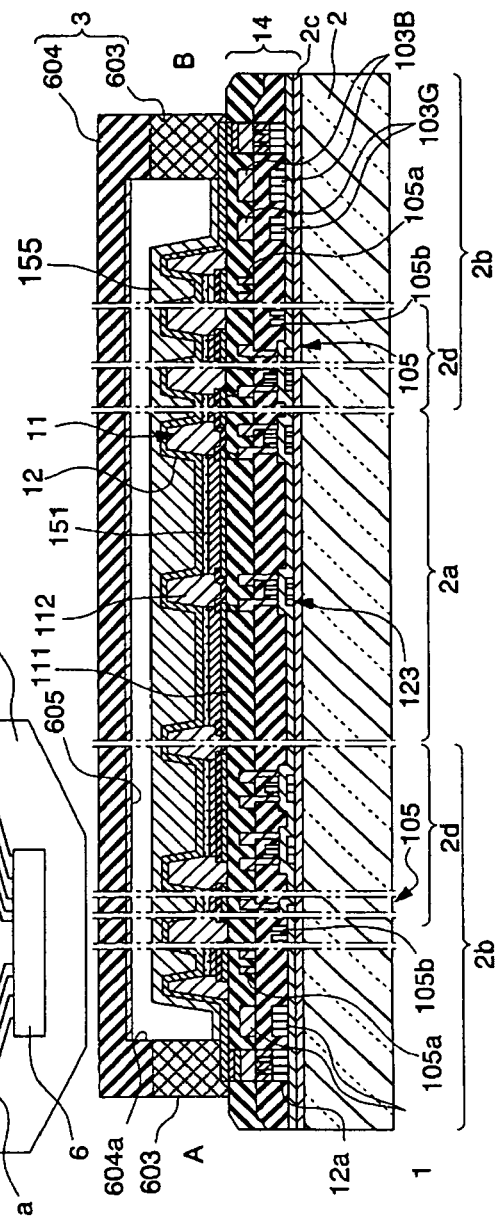
FIG.2A
FIG.2B

ORGANIC ELECTROLUMINESCENT DEVICE WITH HIL/HTL SPECIFIC TO EACH RGB PIXEL

RELATED APPLICATIONS

This application claims priority to Japanese Patent Application No. 2003-290653 filed Aug. 8, 2003 which is hereby expressly incorporated by reference herein in its entirety.

BACKGROUND

1. Technical Field

The present invention relates to an organic EL device capable of improving characteristics of individual organic EL elements and display characteristics, a method of manufacturing the organic EL device, and an electronic apparatus.

2. Background Art

Recently, organic electroluminescent elements (hereinafter, referred to as organic EL elements) using organic materials functioning as light-emitting layers have been developed as self-emitting display elements. In an organic EL device having a plurality of the organic EL elements, functional materials for forming functional layers such as light-emitting layers and carrier injection/transport layers, that is, hole injection/transport layers or electron injection/transport layers, has become one of the important factors which affects the characteristics of a completed organic EL device.

Particularly, in such an organic EL device in which materials for forming the light-emitting layers are polymers, the functional layers typically comprise light-emitting layers and hole injection/transport layers (for example, see Japanese Unexamined Patent Application Publication No. 2000-323276 and Japanese Unexamined Patent Application Publication No. 2002-231447. In an organic EL device which is capable of displaying full colors, the organic EL elements comprise organic EL elements for emitting a red light component, organic EL elements for emitting a green light component, and organic EL elements for emitting a blue light component. Among the organic EL elements emitting different colors of light components, the light-emitting layers for every color are respectively composed of different materials, but the other functional layers have the same material to improve the productivity.

In addition, a technique for changing the construction of components other than functional layers, particularly, construction of cathodes by changing colors is disclosed. More specifically, a technique for forming cathodes by providing LiF to light-emitting layers of only the organic EL elements for emitting a blue light component is disclosed.

However, in the aforementioned organic EL device, particularly, an organic EL device for displaying full colors, since the light-emitting layers are composed of different materials for every color, optimal light-emitting characteristics cannot be obtained. But, in this case, the hole injection/transport layers are formed commonly to the light-emitting layers composed of the different materials, and the electron injection/transport layers are not provided for all the colors. Therefore, organic EL elements having optimal light-emitting conditions cannot be formed.

Recently, improvements in the display characteristics of the organic EL devices have been desired. Hence, it is important to provide the individual organic EL elements having optimal light-emitting characteristics.

In order to solve the problems, the present invention provides an organic EL device capable of improving the characteristics of individual organic EL elements and display characteristics, a method of manufacturing the organic EL device, and an electronic apparatus.

SUMMARY

In order to achieve the objects, the present invention provides an organic EL device comprising a plurality of organic EL elements. Each of the organic EL elements have a pair of electrodes and functional layers and the functional layers includes at least a light-emitting layer and a hole injection/transport layer interposed between the pair of electrodes. The structure of a hole injection/transport layer in one organic EL element is different from those of hole injection/transport layers in other organic EL elements.

Since hole injection/transport properties of the hole injection/transport layers can be adjusted so as to correspond to materials for forming, for example, the light-emitting layers, it is possible to obtain optimal light-emitting characteristics for the individual organic EL elements.

In addition, according to the organic EL device, with respect to components other than the light-emitting layers, a construction of the functional layers of the one organic EL element are different from those of the functional layers of other organic EL elements. Thus, the functional layers having optimal light-emitting characteristics can be formed for the individual materials for forming the light-emitting layers, such that it is possible to obtain a better light-emitting characteristics of the individual organic EL elements. In addition, in a case where the organic EL elements having light-emitting layers are made of the same material and, for example, the light-emitting characteristics obtained at the location of the organic EL elements in the organic EL device are different, the functional layers can be formed so as to correspond to the required light-emitting characteristics, so that it is possible to obtain a better light-emitting characteristics for the individual organic EL elements.

In addition, in the organic EL device, a color emitted from a light-emitting layer of the one organic EL element is different from colors emitted from light-emitting layers of the other organic EL elements.

In this case, as described above, the functional layers having optimal light-emitting characteristics can be formed for the individual materials for forming the light-emitting layers, so that it is possible to obtain better light-emitting characteristics for the individual organic EL elements.

In addition, in the organic EL device, the one organic EL element has an electron injection/transport layer, and the other organic EL elements have no electron injection/transport layers.

In this case, the electron injection/transport layers, which is only required for a specific light-emitting layer and not for other light-emitting layers, can be selectively formed in the organic EL elements, such that it is possible to obtain optimal light-emitting characteristics for all organic EL elements.

In addition, in this case, a functional layer, which is only required for a specific light-emitting layer and not for other light-emitting layers, can be selectively formed in the organic EL elements, so that it is possible to obtain optimal light-emitting characteristics for all organic EL elements.

In addition, in the organic EL device, even though functional layers of other organic EL elements have the same function as the components of the functional layers of the one organic EL element, the components of functional layers other than at least a light-emitting layer of one organic EL element are different from those of functional layers of other organic EL elements.

As a result, a material affecting a slight difference in performance from the light-emitting layers can be used as the material for the components of the functional layers other than the light-emitting layers.

In addition, in the organic EL device, the component, which is different in the one organic EL element and other organic EL elements, may be hole injection/transport layers.

Since the hole injection/transport properties of the hole injection/transport layers can be adjusted so as to correspond to materials for forming the light-emitting layers, it is possible to obtain optimal light-emitting characteristics for the individual organic EL elements.

In addition, in the organic EL device, a material for forming the hole injection/transport layer in the one organic EL element may be a polythiophene derivative. Further, in the organic EL device, a material for forming the hole injection/transport layer in the one organic EL element is a mixture of 3, 4-polyethylenedioxythiophene and polystyrene sulfonic acid.

Since the polythiophene derivative, for example, the 3,4-polyethylenedioxythiophene has a good hole injection/transport property, the resulting hole injection/transport layers have a better light-emitting characteristics than the light-emitting layers.

In addition, in the organic EL device, both a material for forming the hole injection/transport layers of the one organic EL element and a material for forming the hole injection/transport layers of the other organic EL elements may be a mixture of 3,4-polyethylenedioxythiophene and polystyrene sulfonic acid, and the mixing ratio of 3,4-polyethylenedioxythiophene and polystyrene sulfonic acid in the mixture in the one organic EL element may be different from that in other organic EL elements.

As a result, since the mixing ratio of 3,4-polyethylenedioxythiophene and polystyrene sulfonic acid in the mixture can vary, the resistance value of the resulting hole injection/transport layers may also vary, such that the hole injection/transport properties can be made different for the hole injection/transport layers. Therefore, the hole injection/transport layers having the hole injection/transport properties corresponding to the materials for forming the light-emitting layers are formed in the individual organic EL elements, such that it is possible to obtain optimal light-emitting characteristics for the individual organic EL elements.

In addition, in the organic EL device, the mixing ratio of 3,4-polyethylenedioxythiophene and polystyrene sulfonic acid in the mixtures may be in a range of 1:10 to 1:30.

As a result, it is possible to efficiently obtain the required hole injection/transport properties by securing the resistance values of the resulting hole injection/transport layers.

In addition, in the organic EL device, both a material for forming the hole injection/transport layers of the one organic EL element and a material for forming the hole injection/transport layers of the other organic EL elements are a mixture of 3,4-polyethylenedioxythiophene and polystyrene sulfonic acid, and a mean particle diameter of the mixture of the one organic EL element is different from that of the other organic EL elements.

As a result, since the mean particle diameter of the mixtures can be different, the resistance values of the resulting hole injection/transport layers may be varied, such that the hole injection/transport properties can be different for the hole injection/transport layers. Therefore, the hole injection/transport layers having the hole injection/transport properties corresponding to the material for forming the light-emitting layers can be formed for the individual organic EL elements, so that it is possible to obtain optimal light-emitting characteristics for the individual organic EL elements.

In addition, in the organic EL device, difference in the mean particle diameters of the mixture may be in a range of 20 to 60 nm.

As a result, it is possible to efficiently obtain the required hole injection/transport properties by varying the resistance values of the resulting hole injection/transport layers.

In addition, in the organic EL device, as a component of the functional layers other than the light-emitting layers, the component, which is included in the one organic EL element among the organic EL elements and not in the other organic EL elements, may be used for the electron injection/transport layer.

In this case, the electron injection/transport layers, which is required for a specific light-emitting layer and not required for other light-emitting layers, can be selectively formed in the organic EL elements, such that it is possible to obtain optimal light-emitting characteristics for all organic EL elements.

In addition, in the organic EL device, a material for forming the electron injection/transport layer may be an organic metal compound.

As a result, the material for forming the electron injection/transport layer can be formed by using a wet method such as a liquid droplet ejection method, so that production can be efficient.

In addition, in the organic EL device, a work function of a metal in the organic metal compound may be less than 3.0 eV.

As a result, the electron injection/transport layer made of the organic metal compound has a better electron injection/transport property.

In addition, the organic EL device may comprise organic EL elements for emitting a red light component, organic EL elements for emitting a green light component, and organic EL elements for emitting a blue light component.

As a result, it is possible to display full colors.

The present invention also provides a method of manufacturing a organic EL device comprising a plurality of organic EL elements, each of the organic EL elements having a pair of electrodes and functional layers, the functional layers including at least a light-emitting layer and a hole injection/transport layer interposed between the pair of electrodes. In this method, a construction of a hole injection/transport layer in one organic EL element is different from those of hole injection/transport layers in other organic EL elements.

Since hole injection/transport properties of the hole injection/transport layers can be adjusted so as to correspond to materials for forming, for example, the light-emitting layers, it is possible to obtain optimal light-emitting characteristics for the individual organic EL elements.

In addition, according to the method of manufacturing the organic EL device, since, with respect to components other than the light-emitting layers, the constructions of the functional layers of the one organic EL element are different from those of the functional layers of other organic EL elements, the functional layers having optimal light-emitting characteristics can be formed for the individual materials for forming, for example, the light-emitting layers as described above, so that it is possible to obtain better light-emitting characteristics of the individual organic EL elements. In addition, in a case where the organic EL elements having light-emitting layers are made of the same material and, for example, the light-emitting characteristics obtained at the location of the organic EL elements in the organic EL device are different, the functional layers can be formed so as to correspond to the required light-emitting characteristics, so that it is possible to obtain better light-emitting characteristics of the individual organic EL elements.

In addition, in the method of manufacturing the organic EL device, at least one layer of the functional layers may be formed by applying a liquid material containing a material for forming the functional layers using a liquid droplet ejection method.

As a result, a desired amount of the liquid material can be accurately applied on the desired locations with the liquid droplet ejection method, so that it is possible to easily adjust the constructions of the functional layers for individual organic EL elements.

The present invention also provides an electronic apparatus comprising the aforementioned organic EL device or an organic EL device manufactured by using the aforementioned method.

According to the electronic apparatus, the organic EL device having better light-emitting characteristics for the individual organic EL elements is included as a display unit, so that it is possible to obtain better display characteristics.

BRIEF DESCRIPTION OF THE DRAWINGS

FIG. 2(a) is a plan view showing an organic EL device, and FIG. 2(b) is a sectional view taken along line AB of FIG. 2(a).

DETAILED DESCRIPTION

Now, the present invention will be described in detail.

Figure 1:
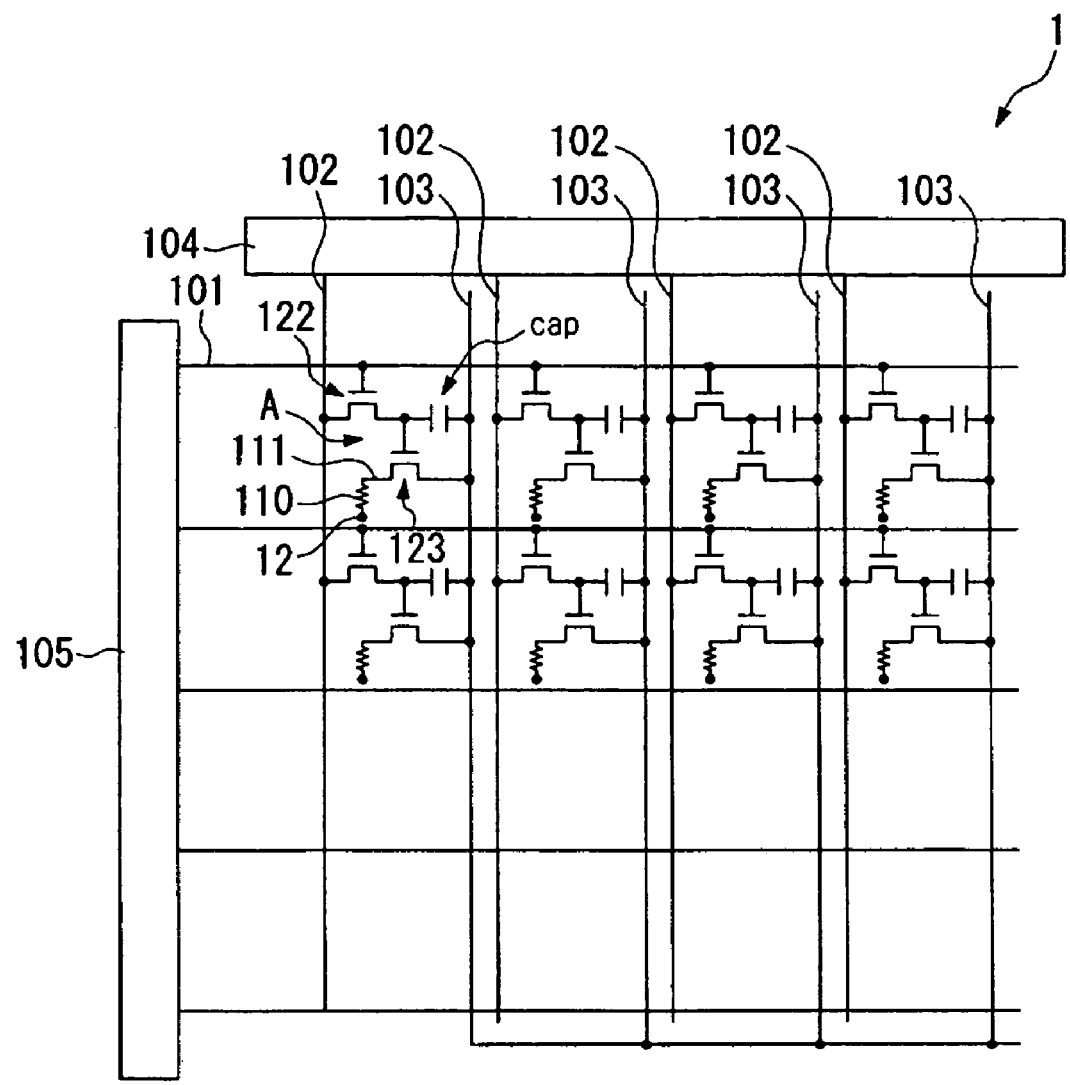
FIG. 1 is a schematic plan view showing a wiring structure of an organic EL device according to an embodiment of the present invention.

FIGS. 1 and 2 illustrate an active matrix display apparatus for full color display to which an organic EL device according to an embodiment of the present invention is applied. In the figures, reference numeral 1 denotes the organic EL device.

FIG. 1 is a schematic plan view showing a wiring structure of the organic EL device 1 according to the embodiment. FIG. 2 illustrates a schematic plan view and a schematic sectional view showing the organic EL device 1 according to the embodiment.

As shown in FIG. 1, the organic EL device 1 comprises wiring lines including a plurality of scan lines 101, a plurality of signal lines 102 intersecting the scan lines 101, and a plurality of power lines 103 extending parallel to the signal lines 102, and pixel regions A are formed at intersections of the scan lines 101 and the signal lines 102.

A data driving circuit 104 comprising a shift register, a level shifter, a video line, and an analog switch is connected to the signal lines 102. In addition, a scan driving circuit 105 comprising shift registers and level shifters is connected to the scan lines 101.

In each of the pixel regions A, a first thin film transistor 122 having a gate electrode to which a scan signal is provided via one of the scan lines 101, a storage capacitor cap for storing a pixel signal provided from one of the signal lines 102 via the first thin film transistor 122, a second thin film transistor 123 having a gate electrode to which the pixel signal stored in the storage capacitor cap is provided, a pixel electrode (anode) 111 to which a driving current flows from one of the power lines 103 when the pixel electrode (anode) 111 is connected to the power line 103 via the second thin film transistor 123, and the light emitting portion 110 which is interposed between the pixel electrode (anode) 111 and a counter electrode (cathode) 12 are provided. The pixel electrode 111, the counter electrode 12, and the light emitting portion 110 constitute the organic EL element in the present invention.

According to the above construction, when the first thin film transistor 122 turns on by driving the scan line 101, a potential of the signal line 102 is stored in the storage capacitor cap, and the on/off state of the second thin film transistor 123 is determined based on the state of the storage capacitor cap. Next, current flows from the power line 103 to the pixel electrode 111 via a channel of the second thin film transistor 123, and the current flows into the cathode 12 via the light-emitting portion 110. The light-emitting portion 110 emits light based on an amount of the current thereof.

As shown in FIGS. 2(a) and 2(b), the organic EL device 1 according to the present embodiment comprises a substrate 2 made of a light-transmitting material such as glass, a plurality of organic EL elements arranged in a matrix on the substrate 2, and a sealing substrate for sealing the organic EL elements. Each of the organic EL elements disposed on the substrate 2 comprises the pixel electrode 111, the light-emitting portion 110, and the cathode 12 as described above.

The substrate 2 is a transparent (light-emitting) material such as glass. A display region 2a is provided in the central region of the substrate 2, and a non-display region 2b is provided along the periphery of the substrate 2, that is, outside the display region 2a.

The display region 2a is an effective display region, which is constructed by the organic EL elements arranged in the matrix. In addition, a dummy display region 2d is provided adjacent to the display region 2a in the non-display region 2b.

As shown in FIG. 2(b), a circuit element portion 14 is provided between the substrate 2 and an EL element portion 11 comprising the organic EL elements and bank portions. The aforementioned scan lines, the signal lines, the storage capacitors, the first thin film transistors, and the second thin film transistors 123 are formed in the circuit element portion 14.

The cathodes 12 are connected to the cathode wiring lines 12a whose ends are formed on the substrate 2, and ends of the cathode wiring lines are connected to wiring lines 5a formed on a flexible substrate 5. The wiring lines 5a are connected to a driving IC 6 (a driving circuit) formed on the flexible substrate 5.

As shown in FIGS. 2(*a*) and 2(*b*), the aforementioned power lines 103 (103R, 103G, 103B) are disposed in the non-display region 2b of the circuit element portion 14.

The scan driving circuits 105 are disposed at both sides of the display region 2a of FIG. 2(*a*). The scan driving circuits 105 are provided in the circuit element portion 14 below the dummy region 2d. In addition, driving circuit control signal wiring lines 105a and power wiring lines 105b for driving circuit which are connected to the scan line driving circuits 105 are disposed in the circuit element portion 14.

An inspection circuit 106 is disposed at an upper side of the display region 2a of FIG. 2(*a*). The quality and defects of the display apparatus are inspected with the inspection circuit 106 during production or at the time of shipment.

As shown in FIG. 2(*b*), a sealing portion 3 is provided on the EL element portion 11. The sealing portion 3 comprises a sealing resin 603 applied on the substrate 2 and a sealing substrate 604. The sealing resin 603 is a thermosetting resin or a UV-cured resin, and more preferably, an epoxy resin.

The sealing resin 603 is applied in a ring shape around the periphery of the substrate 2 by using, for example, a microdispenser to adhere the sealing substrate 604 to the substrate 2. According to the construction, the sealing resin 603 prevents water or oxygen from penetrating into the space between the substrate 2 and the sealing substrate 604, and the light-emitting layers (not shown) formed within the cathodes or the EL element portion 11 from being oxidized.

Since the sealing substrate 604 is made of glass or metal. The sealing substrate is adhered to the substrate with the sealing resin 603, and concave portions 604a are formed inside thereof A getter 605 capable of absorbing water and oxygen is attached on the concave portion 604a to absorb the water or oxygen that penetrates the sealing substrate 604.

Figure 3:
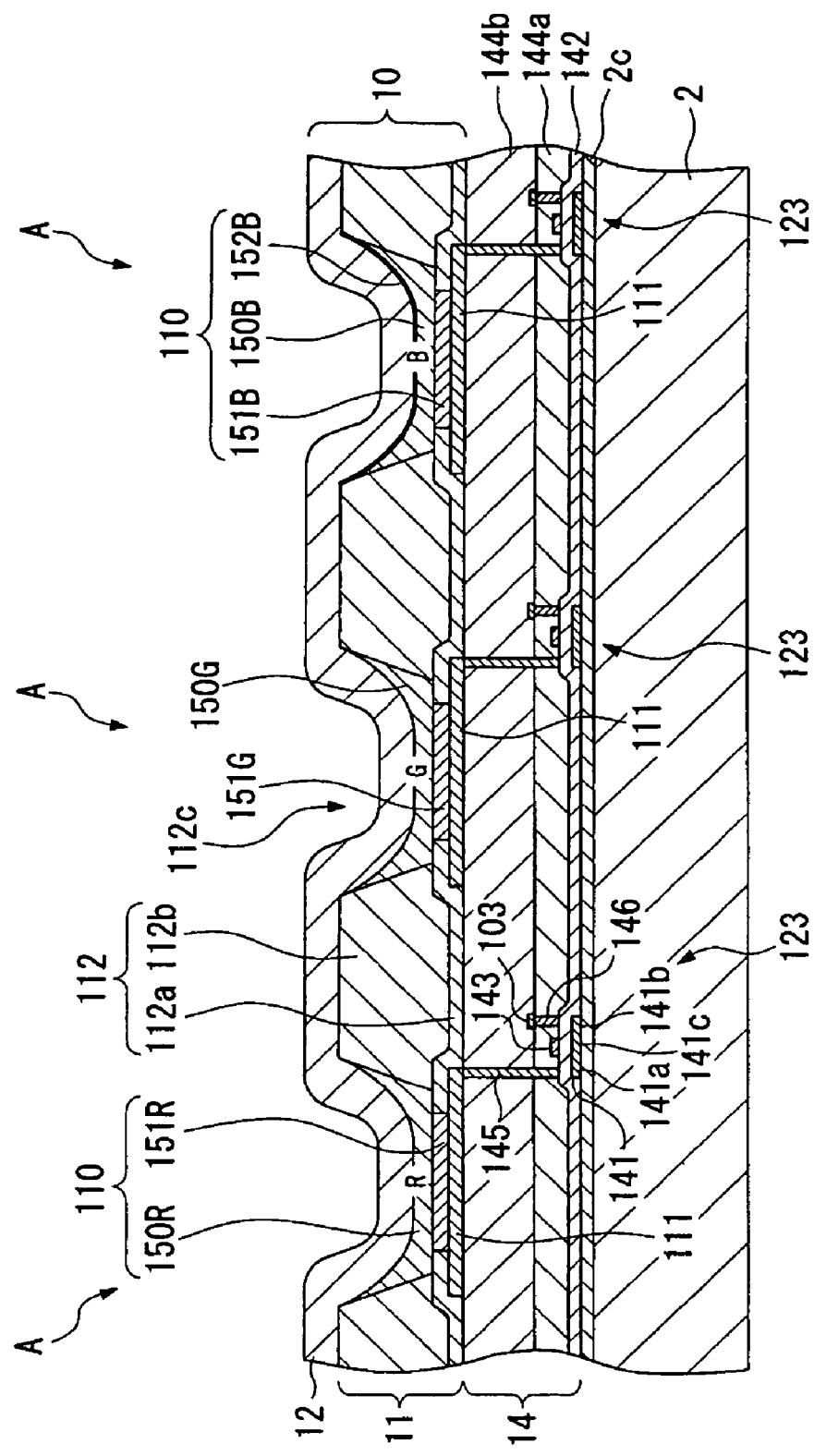
FIG. 3 is a sectional side view showing a main portion of the organic EL device shown in FIGS. 1 and 2.

FIG. 3 illustrates an enlarged sectional side view of the display region of the organic EL device 1. FIG. 3 illustrates three pixel regions. In the organic EL device 1, the circuit element portion 14, where circuits such as TFTs are formed, and the EL element portion 11, where the light-emitting portions 110 are formed, are laminated in this order on the substrate 2.

In the organic EL device 1, light emitted from the light-emitting portion 110 toward the substrate 2 transmits through the circuit element portion 2 and the substrate 2 and is emitted to the rear side of the substrate 2 (toward an observer). On the other hand, light emitted from the light-emitting portion 110 toward the opposite side of the substrate 2 is reflected by the cathode 12, transmits through the circuit element portion 14 and the substrate 2, and is emitted to the rear side of the substrate 2. (toward the observer).

Alternatively, if a transparent material is used for the cathode 12, light can be emitted from the cathode 12.

In the circuit element portion 14, a base protection film 2c made of a silicon oxide film is provided on the substrate 2. Semiconductor films 141 made of polycrystalline silicon are provided in an island shape on the base protection film 2c. In each of the semiconductor films 141, a source region 141a and a drain region 141b are formed by injecting highly-doped P ions. A region where the P ions are not injected becomes a channel region 14c.

In the circuit element portion 14, a transparent gate insulating film 142 is provided to cover the base protection film 2c and the semiconductor films 141. Gate electrodes 143 (the scan lines 101) made of Al, Mo, Ta, Ti, W, or the like, are provided on the gate insulating film 142. First and second transparent interlayer insulating films 144a and 144b are provided on the gate electrodes 143 and the gate insulating film 142. The gate electrodes 143 are provided at positions corresponding to the channel regions 141c of the semiconductor films 141.

Contact holes 145 and 146 are formed through the first and second interlayer insulating films 144a and 144b and are connected to the source and drain regions 141a and 141b of the semiconductor films 141, respectively. The contact holes 145 and 146 are filled with conductive materials.

The transparent pixel electrodes 111 made of ITO are patterned in a predetermined shape on the second interlayer insulating film 144b. The contact holes 145 are connected to the pixel electrodes 111.

In addition, the contact holes 146 are connected to the power lines 103.

As a result, the second thin film transistors 123 connected to the pixel electrodes 111 are formed in the circuit element portion 14.

In addition, although the aforementioned storage capacitors cap and the first thin film transistors 122 are also provided in the circuit element portion 14, they are omitted in FIG. 3.

The EL element portion 11 comprises the light-emitting portions 110 laminated on the plurality of the pixel electrodes 111; the bank portion provided between the pixel electrodes 111 and the light-emitting portions 110 to partition the light-emitting portions 110, and the counter electrodes (cathodes 12) provided on the bank portions 112 and the light-emitting portions 110.

Since the pixel electrodes 111 are made of a transparent conductive material such as ITO, the pixel electrodes 111 are patterned in a rectangular shape in plan view. The bank portions 112 are provided between the pixel electrodes 111.

The bank portions 112 comprise an inorganic bank layer 112a made of $SiO_2$ over the substrate 2 and an organic bank layer 112b formed on the inorganic bank layer 112a.

Since the inorganic bank layers 112a are formed over the circumferential portions of the pixel electrodes 111, the circumferential portions of the pixel electrodes 111 and the inorganic bank layers 112a are overlapped in plan view. In addition, some portions of the pixel electrodes 111 and the organic bank layers 111b are also overlapped in plan view.

Openings 112c are formed in the organic bank layers 112b. As described later, materials for forming the functional layers are disposed in the openings 112c and subjected to a film formation process, so that the light-emitting portions 110 constituting the functional layers are formed. In addition, the organic bank layers 112b are made of a material having heat resistance and solvent resistance such as acryl resin and polyimide resin.

As described above, the light-emitting portions 110 functioning as the functional layers in the present invention are provided between the pixel electrodes (anodes) 111 and the counter electrodes (cathodes) 12, so that the light-emitting portions together with the pixel electrodes 111 and the counter electrodes 12 constitutes the organic EL elements. In the embodiment, as described above, the organic EL elements include the organic EL elements serving as the pixels R emitting a red color component, the organic EL elements serving as the pixels G emitting a green color component, and the organic EL elements serving as the pixels B emitting a blue color component in order to display full colors.

In the present embodiment, since the materials for forming the light-emitting layers 150 (150R, 150G, 150B) in the light-emitting portions (functional layers) 110 are different depending on the colors emitting therefrom, the constructions of the three types of the organic EL elements are different. In addition, the hole injection/transport layers 151 (151R, 151G, 151B) are different depending on the colors emitted from the light-emitting layers. Furthermore, in the embodiment, the electron injection/transport layers 152 are only provided in the organic EL elements emitting the blue color. According to this construction, with respect to components other than the light-emitting layers, the light-emitting portions (functional layers) 110 are different for the three types of the organic EL elements emitting the red, green, and blue colors.

The hole injection/transport layers 151 have a function of injecting holes of the pixel electrode (anodes) 111 into the light-emitting layers 150 or transporting the holes therein. Since the hole injection/transport layers are provided between the pixel electrodes 111 and the light-emitting layers 150, it is possible to improve the light-emitting efficiency and the life time of the light-emitting layers 150. In addition, in the light-emitting layers 150, the holes injected from the hole injection/transport layers 151 and the electrons injected from the counter electrodes (cathodes) 12 are recombined to emit light.

In the embodiment, the hole injection/transport layers 151 R in the red organic EL elements is made of, for example, a mixture of polyaniline and polystyrene sulfonic acid (PSS). More specifically, 0.7 parts by weight of the mixture of polyaniline and polystyrene sulfonic acid (PSS) are dispersed into a dispersion medium, which is 50 parts by weight of a mixture of water, 50 parts by weight of diethylene glycol (DEG) and 0.1 part by weight of a surfactant (for example, SANFIRNO 61 (a brand name)), to become a liquid material for forming the hole injection/transport layers 151R. As described later, the liquid material is applied in the openings 112c by the liquid droplet ejection method to form films having a thickness of 50 nm, and thus the hole injection/transport layers 151R are formed.

In addition, the hole injection/transport layers 151 R in the red organic EL elements are not limited to the mixture of polyaniline and polystyrene sulfonic acid, but other materials, for example, a mixture of a polythiophene derivative, particularly, 3,4-polyethylenedioxythiophene (PEDOT) and polystyrene sulfonic acid (PSS) can be used as main components. In some cases, the mixture may be dispersed in the aforementioned dispersion medium (water/DEG/surfactant) to form a liquid material, and the liquid material is applied in the openings 112c by the liquid droplet ejection method to form films, so that the hole injection/transport layers 151R can be formed.

The mixture of 3,4-polyethylenedioxythiophene (PEDOT) and polystyrene sulfonic acid (PSS), in which the PEDOTs are connected to a long chain of the PSSs, is dispersed into the dispersion medium to form gel particles. The gel particles are mechanically crushed to adjust a mean particle diameter thereof, so that a resistance value of the resulting film (hole injection/transport layer) can be adjusted.

In a case where the mixture of 3,4-polyethylenedioxythiophene (PEDOT) and polystyrene sulfonic acid (PSS) is used as a main component of the material for forming the hole injection/transport layers 151 R of the red organic EL elements, the mixing ratio (weight ratio) of the PEDOT and the PSS is in a range of 1:10 to 1:15 and the mean particle diameter is in a range of 50 to 60 nm. As a result, the resistance value of the resulting hole injection/transport layers 151R can be adjusted, so that it is possible to obtain optimal light-emitting property of the light-emitting layers of the red organic EL elements described later. That is, as the portion of PSS in the mixing ratio (weight ratio) of the PEDOT and the PSS is increased, the resistance value of the resulting films (hole injection/transport layers) can be increased. In addition, as the mean particle diameter of the mixture is decreased, the resistance value of the resulting films (hole injection/transport layers) can be increased. Therefore, since the resistance value of the resulting hole injection/transport layers can be decreased by adjusting the mixing ratio and the mean particle diameter as described above, the resistance value of the resulting hole injection/transport layers 151R can be relatively decreased, so that it is possible to obtain optimal light-emitting characteristics of the red organic EL elements.

In the green organic EL elements, the hole injection/transport layers 151G are made of the aforementioned mixture of 3,4-polyethylenedioxythiophene (PEDOT) and polystyrene sulfonic acid (PSS). As main components of the material for forming the hole injection/transport layers 151G in the green organic EL elements, 3,4-polyethylenedioxythiophene (PEDOT) and polystyrene sulfonic acid (PSS) are very suitably used with a mixing ratio (weight ratio) of 1:30, and the mean particle diameter is in a range of 50 to 60 nm. Alternatively, as main components of the hole injection/transport layers 151G in the green-color the PEDOT and the PSS are very suitably used with a mixing ratio (weight ratio) of 1:20, and the mean particle diameter is in a range of 20 to 30 nm.

These mixtures may be dispersed at 0.7 parts by weight into the aforementioned dispersion medium (water; 50 parts by weight/DEG; 50 parts by weight; surfactant; 0.1 part by weight) to form a liquid material, and the liquid material is applied in the openings by liquid droplet ejection method to form films having a thickness of about 50 nm, so that the hole injection/transport layers 151G can be formed.

If the mixture is used as the main components of the material for forming the films, the resistance values of the resulting films (hole injection/transport layers) is larger than the resistance value of the mixture of the PEDOT and the PSS used to form the hole injection/transport layers 151R of the red organic EL elements. Therefore, it is possible to obtain optimal light-emitting characteristics of the green organic EL elements.

In the blue organic EL elements, the hole injection/transport layers 151B are also made of the aforementioned mixture of 3,4-polyethylenedioxythiophene (PEDOT) and polystyrene sulfonic acid (PSS). As main components of the material for forming the hole injection/transport layers 151B in the blue organic EL elements, 3,4-polyethylenedioxythiophene (PEDOT) and polystyrene sulfonic acid (PSS) are very suitably used with a mixing ratio (weight ratio) of 1:20, and the mean particle diameter is in a range of 50 to 60 nm.

These mixtures may be dispersed at 0.7 parts by weight into the aforementioned dispersion medium (water; 50 parts by weight/DEG; 50 parts by weight/surfactant; 0.1 part by weight) to form a liquid material, and the liquid material is applied in the openings 112c by the liquid droplet ejection method to form films having a thickness of about 50 nm, so that the hole injection/transport layers 151B can be formed.

If the mixture is used as the main components of the material for forming the films, the resistance value of the resulting films (hole injection/transport layers) may be decreased below the resistance value of the mixture of the PEDOT and the PSS used to form the hole injection/transport layers 151G of the green organic EL elements. Therefore, it is possible to obtain optimal light-emitting characteristics of the blue organic EL elements.

CN-PPV (hereinafter, referred to as "Compound 1") can be very suitably used as a material for forming the light-emitting layers 150R of the red organic EL elements. Compound 1 is dissolved at 0.9 percent by weight into a solvent, which is a mixture of 1:1 of cyclohexylbenzene (CHB) and isopropylbiphenyl (IPBP), to constitute a liquid material for forming the light-emitting layers 150R. Next, the liquid material is applied on the hole injection/transport layers 151R in the openings 112c by the later-described liquid droplet ejection method to form films having a thickness of about 80 nm, so that the light-emitting layers 150R are formed. In addition, the liquid material using the CN-PPV can be also used for any one of the aforementioned two types of materials for the hole injection/transport layers 151R, so that the resulting films (light-emitting layers 150R) made of the CN-PPV can show optimal light-emitting characteristics.

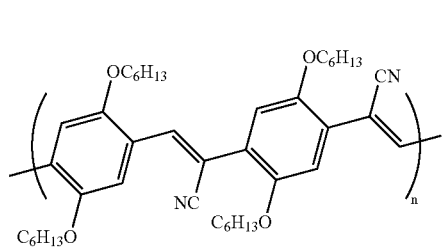

Compound 1

A mixture of 1:1 of F8BT (hereinafter, referred to as "Compound 2") and TFB (hereinafter, referred to as "Compound 3") can be very suitably used as a material for forming the light-emitting layers 150 of the green organic EL elements. The mixture of Compounds 2 and 3 is dissolved at 0.8 percent by weight into the aforementioned solvent, which is a mixture of 1:1 of cyclohexylbenzene (CHB) and isopropylbiphenyl (IPBP), to constitute a liquid material for forming the light-emitting layers 150G. Next, the liquid material is applied on the hole injection/transport layers 151G in the openings 112c by the later-described liquid droplet ejection method to form films having a thickness of about 80 nm, so that the light-emitting layers 150G are formed. In addition, the liquid material using the aforementioned mixture can be used for any one of the aforementioned two types of materials for the hole injection/transport layers 151G, so that the resulting films (light-emitting layers. 150G) can show optimal light-emitting characteristics.

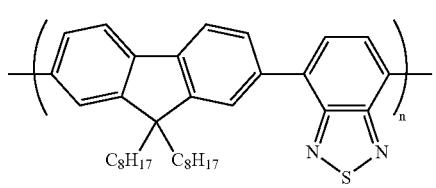

Compound 2

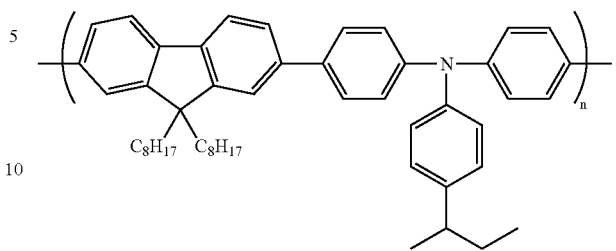

Compound 3

F8 (poly-dioctylfluorene) (hereinafter, referred to as "Compound 4") can be very suitably used as a material for forming the light-emitting layers 150B of the blue light organic EL elements. Compound 4 is dissolved at 0.8 percent by weight into a solvent, which is a mixture of 1:1 of the CHB and the IPBP to constitute a liquid material for forming the light-emitting layers 150B as described above. Next, the liquid material is applied on the hole injection/transport layers 151B in the openings 112c by the later-described liquid droplet ejection method to form films having a thickness of about 70 nm, so that the light-emitting layers 150B are formed. The liquid material using the F8 can be also used for the liquid injection/transport layers 151B, so that the resulting films (light-emitting layers 151B) can show optimal light-emitting characteristics.

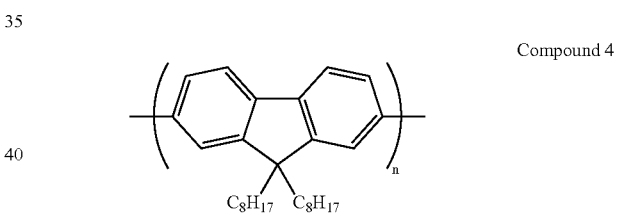

Compound 4

In addition, in the organic EL elements for emitting a red color and the organic EL element emitting a green color for the three types of the organic EL elements, the functional layers (light-emitting portions 110) is formed by the hole injection/transport layers 151 (151R, 151G) and the light-emitting layers 150 (150R, 150G) as described above. On the other hand, in the organic EL elements emitting a blue color, in addition to the hole injection/transport layers 151B and the light-emitting layers 150B, electron injection/transport layers 152B are provided as the functional layers (light emitting portions 110).

In the embodiment, the electron injection/transport layers 152B are made of an organic metal compound, and particularly, a work function of metal in the organic metal compound is preferably less than 3.0 eV. More specifically, the organic metal compound is made of Li quinolinol (hereinafter, referred to as "Compound 5"). The organic metal compound is generally dissolved into an organic solvent to form a liquid material. Next, the liquid material is ejected with, for example, a liquid droplet ejection method to form films having a thickness of about 0.5 nm, so that the electron injection/transport layers 152B are obtained. In addition, since the electron injection/transport layers 152B are formed on the light-emitting layers 150B, a polar solvent is used as the solvent dissolving the Li quinolinol in order to redissolve the light-emitting layers 150B. More specifically, a solvent mixture obtained by mixing dietyleneglycol monomethyl ether and 1,3-dimetyl-imidazo-lidinone in a mixing ratio of 1:1 is very suitably used. The Li quinolinol is dissolved at 0.05 percent by weight into the solvent mixture to constitute a liquid material.

Compound 5

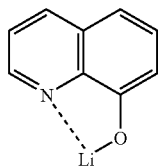

Instead of the Li quinolinol, various types of organic metals can be used as the material for forming the electron injection/transport layers 152B. For example, hexafluoro-acetylacetonatrium (hereinafter, referred to as "Compound 6") is very suitably used.

With this configuration, it is possible to obtain more efficient light-emitting characteristics for the blue light component. That is, because the electron injection/transport layers 152B are provided in the organic EL element emitting a blue light component, the electrons injected from the counter electrodes (cathodes) 12 are efficiently injected into the light-emitting layers 150B via the electron injection/transport layers 152B to be recombined with the holes.

Compound 6

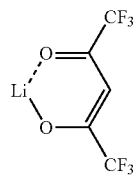

In addition, although the components constituting the functional layers (light-emitting portions 110) in the three types of the organic EL elements, that is, the hole injection/transport layers or the electron injection/transport layers are formed with different materials, the components of the functional layers may be also varied for the organic EL elements emitting the same color in the present invention. That is, among the organic EL elements comprising the light-emitting layers 150 made of the same material, the light-emitting characteristics may be different depending on, for example, the locations of the organic EL elements in the organic EL device. In this case, the functional layers are constructed so as to correspond to the required light-emitting characteristics for the individual organic EL elements emitting the same color, so that it is possible to obtain better light-emitting characteristics of the individual organic EL elements.

The counter electrodes (cathodes) 12 are provided on the light-emitting portions 110 (functional layers) over the entire surface of the EL element portion 11. Each of the counter electrodes (cathodes) 12, which constitutes the pair together with each of the pixel electrodes 111, has a function of flowing a current to the light-emitting portion 110. Each of the counter electrodes is constructed with a laminated film (Ca/Al) of Ca and Al films. Here, for example, the Ca film has a thickness of about 20 nm, and the Al film has a thickness of about 200 nm.

In addition, the counter electrodes (cathodes) 12 may have different constructions for each of organic EL elements. For example, instead of Ca, calcium acetylacetatonate (hereinafter, referred to as "Compound 7") may be formed as a film in the organic EL elements emitting a red color and the organic EL element emitting a blue color. Since the calcium acetylacetatonate can be dissolved into an organic solvent, a liquid material made of calcium acetylacetatonate can be ejected by a liquid droplet ejection method to form the film.

Compound 7

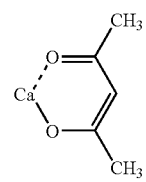

In addition, an anti-oxidation protection layer 155 made of SiO, SiO$_2$, SiN, or the like, may be provided on the counter electrodes (cathodes) 12.

Next, the sealing substrate 604 is disposed on the organic EL elements. The sealing substrate 604 is adhered with the sealing resin 603, as shown in FIG. 2(b). As a result, the organic EL device 1 is obtained.

Now, a method of manufacturing an organic EL device according to the present invention will be described based on the method of manufacturing the organic EL device 1 having the aforementioned construction.

Figure 4:
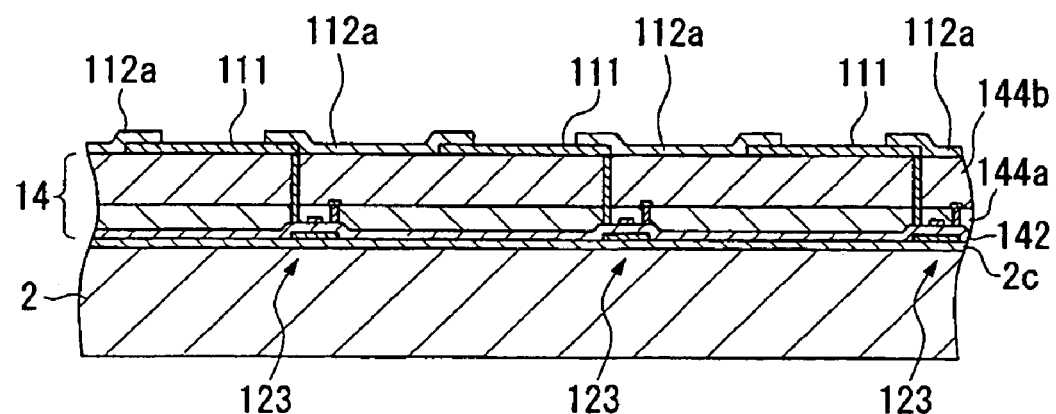
FIG. 4 is a sectional side view for explaining a main portion of a method of manufacturing the organic EL device shown in FIG. 3.

In order to manufacture the organic EL device 1, TFT elements (second thin film transistors 123) and various wiring lines are formed on the substrate 2 in the same manner as a conventional one as shown in FIG. 4. Next, interlayer insulating films or planarization films are formed.

Next, ITO are formed as a film on the substrate 2 by using a vapor deposition method and patterned, so that pixel electrodes 111 are formed.

Figure 5:
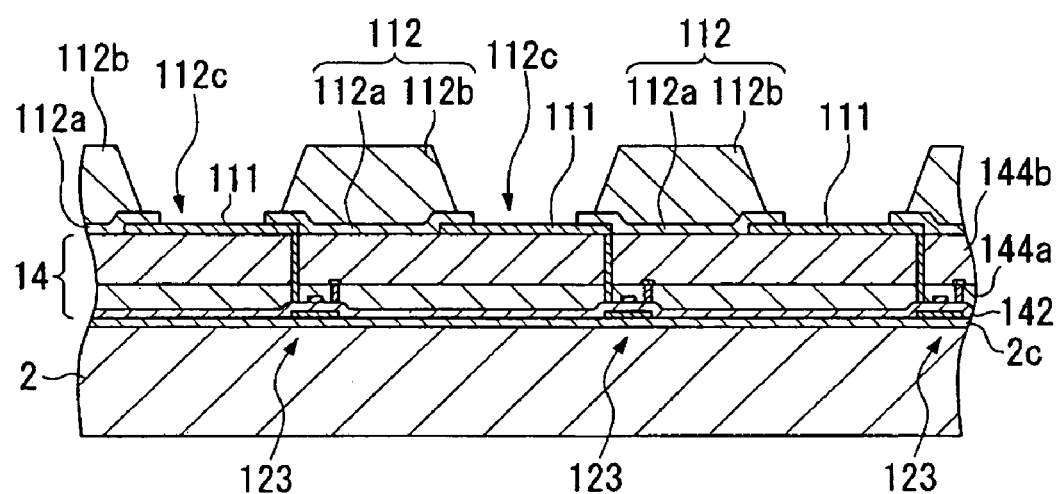
FIG. 5 is a sectional side view for explaining a method of manufacturing the organic EL device shown in FIG. 3.

Subsequently, inorganic banks 112a made of SiO$_2$ are formed on the substrate 2 so as to surround the periphery of the pixel electrodes 111. Next, as shown in FIG. 5, organic banks 112b made of a resin are formed on the inorganic banks 112a, so that openings 112c are formed on the pixel electrodes 111. Here, a polyimide or acryl resin may be used as a material for the organic banks 112b. A material containing fluorine in advance may be used as the material for the organic banks.

Next, the openings 112c surrounded by the inorganic banks 112a and the organic banks 112b are consecutively subjected to an oxygen plasma process and a CF$_4$ process, so that wettability of the surface of the substrate 2 can be controlled.

Next, a liquid material containing a material for forming the hole injection/transport layers is selectively applied in the openings 112c by using the liquid droplet ejection method such as an inkjet method, so that the hole injection/transport layers 151 (151R, 151G, 151B) are provided.

Figure 6A:
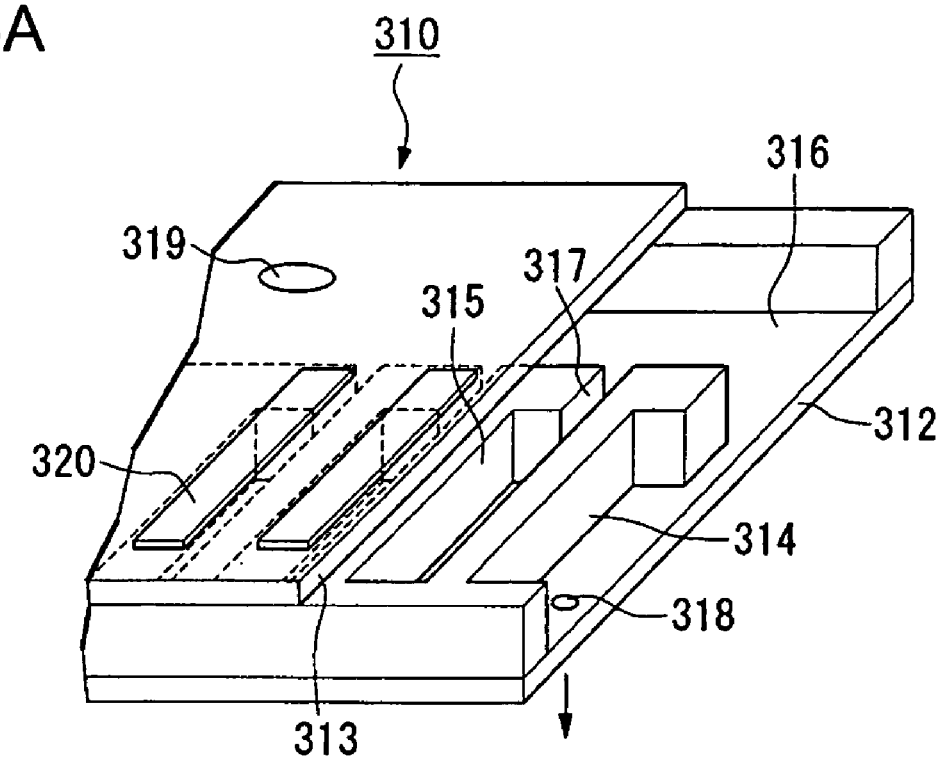
FIGS. 6(a) and 6(b) illustrate internal structures of a liquid droplet ejection head of a liquid droplet ejection device.

A liquid droplet ejection apparatus for ejecting liquid droplets by the liquid droplet ejection method preferably comprises a liquid droplet ejection head 310 shown in FIG. 6(a). The liquid droplet ejection head 310 comprises a nozzle plate 312 made of, for example, stainless steel and a vibrating plate 313, and are attached with partitioning members (reservoir plates) 314 therebetween. A plurality of spaces 315 and a liquid reservoir 316 are formed by the partitioning members 314 between the nozzle plate 312 and the vibrating plate 313. The spaces 314 and the liquid reservoir 316 are filled with a liquid material. The spaces 315 and the liquid reservoir 316 communicate with each other via supply inlets 317. In addition, a plurality of nozzle holes 318 for ejecting the liquid material from the spaces 315 is disposed in a row on the nozzle plate 312. In addition, a hole 319 for supplying the liquid material to the liquid reservoir 316 is provided on the vibrating plate 313.

Figure 6B:
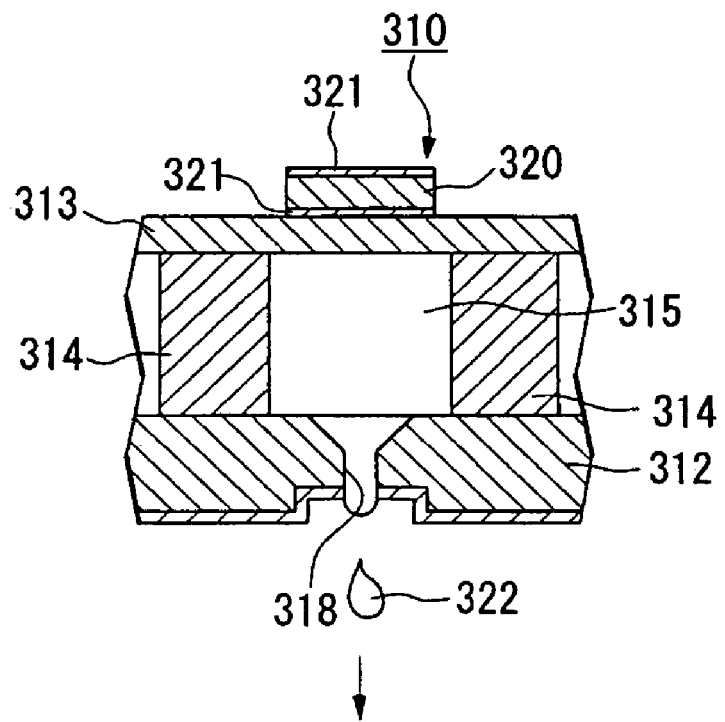

In addition, a piezo-electric element (a piezo element) 320 is attached on the surface of the vibrating plate 313 opposite to the surface thereof facing the space 315, as shown in FIG. 6(b). The piezo-electric element 320 is disposed between a pair of electrodes 321. When turned on, the piezo-element is bent so as to protrude outwards. As a result, the vibrating plate 313 attached to the piezo-electric element 320 is integrated with the piezo-electric element 320 and also bent outwards, so that a volume of the space 315 can increase. Therefore, a liquid material corresponding to the increasing volume of the space 315 flows into the space from the liquid reservoir 316 via each of the supply lets 317. When the piezo-electric element 320 is turned off in this state, the piezo-electric element 320 and the vibrating plate 313 are restored to the original state. Since the space 315 is also restored to the original volume, the pressure of the liquid material in the space 315 increases, so that liquid droplets 322 can be ejected toward the substrate though the nozzle hole 318.

In addition, instead of the piezo-jet type using the aforementioned piezo-electric element 320, well-known types may be adapted to the liquid droplet ejection head 310.

Figure 7:
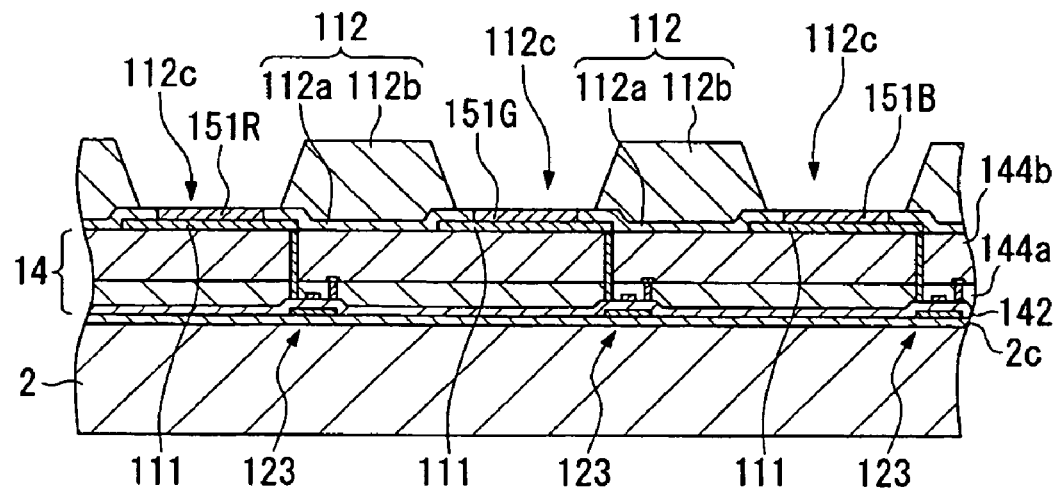
FIG. 7 is a sectional view for explaining a method of manufacturing the organic EL device shown in FIG. 3.

In the ejection of the liquid materials for the hole injection/transports layers by using the liquid droplet ejection heads 310, the aforementioned dedicated materials (materials corresponding to the colors) are ejected for the organic EL elements corresponding to the colors. Next, the materials are individually subjected to a drying process and a sintering process, so that the hole injection/transport layers 151 (151R, 151G, 151B) are formed on the pixel electrodes 111 as shown in FIG. 7. Here, the hole injection/transport layers 151R, 151G, 151B need to be formed and allocated to the red, green, and blue colors, respectively. However, if the liquid droplet ejection method is adapted, it is possible to easily form the hole injection/transport layers by simply allocating the materials (liquid materials) for forming the hole injection/transport layers to desired positions.

Figure 8:
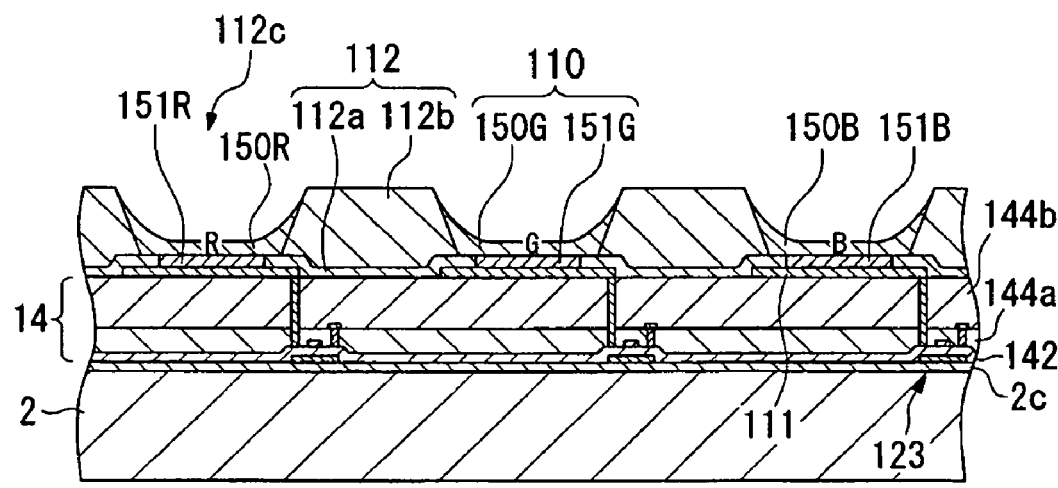
FIG. 8 is a sectional view for explaining a method of manufacturing the organic EL device shown in FIG. 3.

Next, as shown in FIG. 8, the light-emitting layers 150 (150R, 150G, 150B) are formed on the hole injection/transport layers 151 in the openings 112c. In the formation of the light-emitting layers 150R, 150G, 150B, the liquid droplet ejection method (inkjet method) using the aforementioned liquid droplet ejection heads 310 are also very suitably adapted. That is, in the formation of the light-emitting layers 150R, 150G, and 150B, the aforementioned dedicated materials (materials corresponding to the colors) are ejected for the organic EL elements corresponding to the colors. Next, the materials are individually subjected to the drying process and the sintering process, so that light-emitting layers 150 (150R, 150G, 150B) are formed on the hole injection/transport layers 151 (151R, 151G, 151B) as shown in FIG. 8. Here, the light-emitting layers 150R, 150G, 150B need to be formed and allocated to the red, green, and blue colors, respectively. However, if the liquid droplet ejection method is adapted, it is possible to easily form the light-emitting layers by simply allocating the materials (liquid materials) for forming the light-emitting layers to desired positions.

Figure 9:
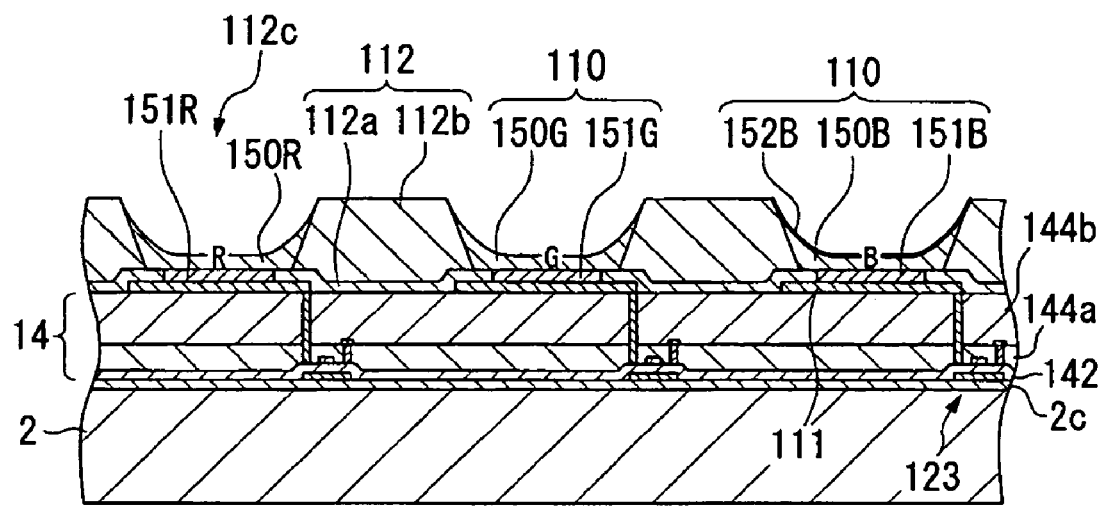
FIG. 9 is a sectional view for explaining a method of manufacturing the organic EL device shown in FIG. 3.

Next, as shown in FIG. 9, the electron injection/transport layers 152B are selectively formed in the openings 112c constituting only the organic EL elements emitting a blue color. In the formation of the electron injection/transport layers 152B, the liquid droplet ejection method (ink-jet method) using the aforementioned liquid droplet ejection heads 310 are also very suitably adapted. In the formation of the electron injection/transport layers 152B, the aforementioned dedicated materials need to be ejected and disposed in the openings 112c, in which the light-emitting layers 150B are formed, and then, subjected to a drying process and a sintering process. However, if the liquid droplet ejection method is adapted, the selective disposition can be easily performed, so that it is possible to easily form the electron injection/transport layers 152B. In addition, the electron injection/transport layers 152B are not necessarily formed, and similarly to the organic EL elements for emitting a green light component, the electron injection/transport layers 152B can be omitted in the construction of the light-emitting portions (functional layers) 110.

Figure 10:
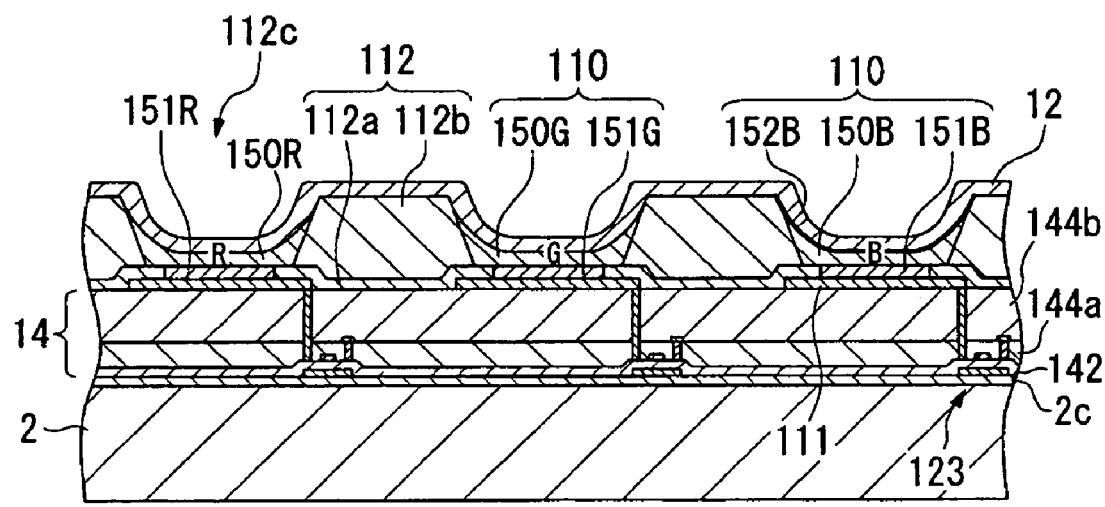
FIG. 10 is a sectional view for explaining a method of manufacturing the organic EL device shown in FIG. 3.

After the light-emitting portions (functional layers) 110 are formed for the corresponding colors, the Ca films are formed to cover the light-emitting portions 110 and the organic banks. The Ca (calcium) films have a thickness of about 20 nm and are formed by using a vapor deposition method like the conventional method. Then, the Al (aluminum) films have a thickness of about 200 nm are formed. As a result, the counter electrodes (cathodes) 12 are formed in a laminated structure (Ca/Al), as shown in FIG. 10. Therefore, a plurality of organic EL elements, each of which comprises the pixel electrode (anode) 111, the light-emitting portion (functional layer) 110 and the counter electrode (cathode) 12, is formed.

In addition, in the organic EL elements emitting a blue colors, in a particular case where the electron injection/transport layers 152B are omitted and the light-emitting portions (functional layers) 110 are formed as described above, the counter electrodes 12 are preferably formed in a laminated structure containing LiF. More specifically, the LiF films having a thickness of about 4 nm are selectively formed by using masks or the like with the vapor deposition method or the like. Next, the Ca films having a thickness of about 10 nm are formed, and then, the Al films having a thickness of about 20 nm are formed together with the organic EL element portions emitting different colors, so that the counter electrode (cathode) 12 are formed in a laminated structure of LiF/Ca/Al.

In particular, as described above, in the organic EL elements emitting a red color and the organic EL elements emitting a blue color, a film may be formed by using the liquid material containing the calcium acetylacetatonate referred to as "Compound 7" instead of Ca in the laminated structure of Ca/Al with the liquid droplet ejection method and an Al film is formed thereon, so that the counter electrodes 12 can be formed.

After the counter electrodes (cathodes) 12 are formed, the protection layer 155 and the sealing resin 603 are formed on the counter electrodes 12, and the sealing substrate 604 is adhered, so that the organic EL device 1 shown in FIG. 2 can be obtained.

In the resulting organic EL device, since the light-emitting portions (functional layers) 110 other than the light-emitting layers have a different construction for the emitting colors, functional layers having optimal light-emitting characteristics for the materials for forming the light-emitting layers 150 (150R, 150G, 150B) can be constructed, so that it is possible to obtain better light-emitting characteristics of the individual organic EL elements. As a result, the display characteristics can be improved, so that it is possible to obtain excellent display having the high quality and high brightness.

In addition, in the aforementioned manufacturing method, although the light-emitting portions (functional layers) 110 other than the light-emitting layers have different components for the three types of the organic EL elements emitting the red, green, and blue colors, in the present invention, the functional layers may have suitably different components for the organic EL elements emitting the same color as described above.

As a result, for example, in a case where the light-emitting characteristics obtained at the locations of the organic EL elements in the organic EL device are different, if the functional layers are constructed so as to correspond to the required light-emitting characteristics, it is possible to obtain better light-emitting characteristics of the individual organic EL elements. Therefore, it is possible to improve the light-emitting characteristics.

In addition, in a case where the functional layers are different components for the organic EL elements emitting the same color, since the display characteristics can be improved, the organic EL device according to the present invention can be adapted to an organic EL device displaying full colors, for example, an organic EL device displaying mono color.

Now, a specific example of an electronic apparatus comprising an organic EL device having the aforementioned construction will be described.

Figure 11:
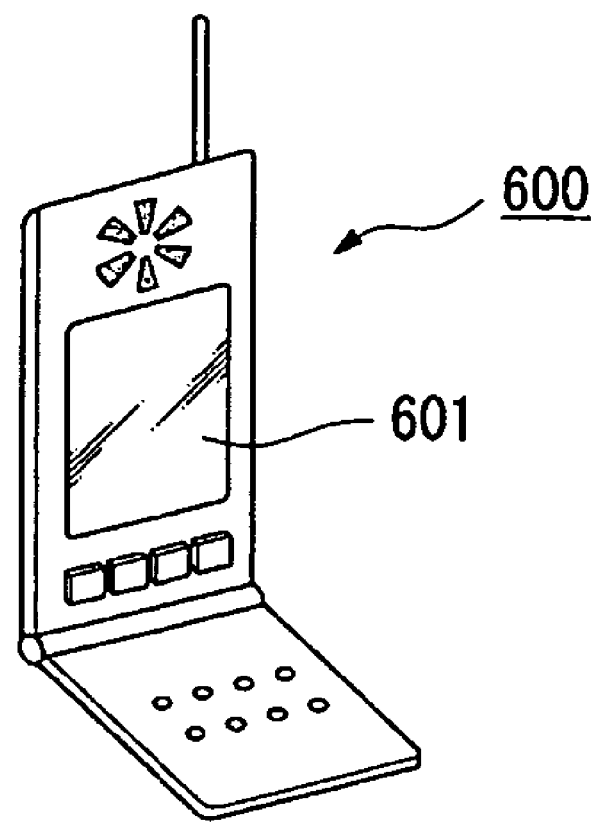
FIG. 11 is a perspective view showing an electronic apparatus according to the present invention.

FIG. 11 is a perspective view showing an example of a cellular phone. In FIG. 11, reference numeral 600 indicates a main body of the cellular phone, and reference numeral 601 indicates a display portion using the organic EL device 1 described above.

Since the organic EL device 1 having improved display characteristics is used as the display unit of the electronic apparatus, the display characteristics of the display unit is sufficiently excellent.

In addition, the organic EL device according to the present invention may be suitably adapted to display units of various electronic apparatuses, for example, portable information processing apparatuses such as word processors and PCs, and wrist-watch type electronic apparatuses.

What is claimed is:

1. An organic EL device comprising:
a plurality of organic EL elements, each of the organic EL elements having a pair of electrodes and functional layers, the functional layers including at least a light-emitting layer and a hole injection/transport layer interposed between the pair of electrodes,
wherein one organic EL element has an organic metal compound layer and the other organic EL elements have no organic metal compound layers and a material of the hole injection/transport layer in the one organic EL element is different from the hole injection/transport layers in the other organic EL elements;
wherein both a material for forming the hole injection/transport layers of the one organic EL element and a material for forming the hole injection/transport layers of the other organic EL elements comprise a mixture of 3,4-polyethylenedioxythiophene and polystyrene sulfonic acid, and
wherein the mixing ratio of 3,4-polyethylenedioxythiophene and polystyrene sulfonic acid in the mixture in the one organic EL element is different from that in the other organic EL elements.

2. The organic EL device according to claim 1, wherein a color emitted from a light-emitting layer of the one organic EL element is different from colors emitted from light-emitting layers of the other organic EL elements.

3. The organic EL device according to claim 1, wherein the one organic EL element has an electron injection/transport layer, and the other organic EL elements have no electron injection/transport layers.

4. The organic EL device according to claim 1, wherein a material for forming the hole injection/transport layer in the one organic EL element comprises a polythiophene derivative.

5. The organic EL device according to claim 1, wherein the mixing ratio of 3,4-polyethylenedioxythiophene and polystyrene sulfonic acid in the mixture is in a range of 1:10 to 1:30.

6. The organic EL device according to claim 1, wherein in the mixture constituting the materials for forming the organic EL elements, a mean particle diameter of the mixture of the one organic EL element is different from that of the other organic EL elements.

7. The organic EL device according to claim 6, wherein a difference in the mean particle diameters of the mixture is in a range of 20 to 60 nm.

8. The organic EL device according to claim 1, wherein a work function of a metal in the organic metal compound is less than 3.0 eV.

9. The organic EL device according to claim 1 comprising organic EL elements for emitting a red light component, organic EL elements for emitting a green light component, and organic EL elements for emitting a blue light component.

10. The organic EL device according to claim 1, wherein the organic EL element having the organic metal compound layer is a blue organic EL element and the other organic EL elements include a red organic EL element and a green organic EL element.

11. A method of manufacturing an organic EL device including a plurality of organic EL elements, each of the organic EL elements having a pair of electrodes and functional layers, the functional layers including at least a light-emitting layer and a hole injection/transport layer interposed between the pair of electrodes, the method comprising the step of:
forming an organic metal compound layer in one organic EL element and forming a hole injection/transport layer in the one organic EL element from a material different from hole injection/transport layers in the other organic EL elements,
wherein both a material for forming the hole injection/transport layers of the one organic EL element and a material for forming the hole injection/transport layers of the other organic EL elements comprise a mixture of 3,4-polyethylenedioxythiophene and polystyrene sulfonic acid, and
wherein the mixing ratio of 3,4-polyethylenedioxythiophene and polystyrene sulfonic acid in the mixture in the one organic EL element is different from that in the other organic EL elements.

12. The method according to claim 11, wherein at least one layer of the functional layers is formed by applying a liquid material containing a material for forming the functional layers using a liquid droplet ejection method.

13. An organic EL device comprising:

a plurality of organic EL elements, each of the organic EL elements having a pair of electrodes and functional layers, the functional layers including at least a light-emitting layer and a hole injection/transport layer interposed between the pair of electrodes, wherein a material of the hole injection/transport layer in one organic EL element is different from those of the hole injection/transport layers in other organic EL elements;

a material for forming the hole injection/transport layer in the one organic EL element comprises a mixture of 3,4-polyethylenedioxythiophene and polystyrene sulfonic acid;

both a material for forming the hole injection/transport layers of the one organic EL element and a material for forming the hole injection/transport layers of the other organic EL elements comprise a mixture of 3,4-polyethylenedioxythiophene and polystyrene sulfonic acid, and a mixing ratio of 3,4 -polyethylenedioxythiophene and polystyrene sulfonic acid in the mixture in the one organic EL element is different from that in the other organic EL elements.

14. The organic EL device according to claim 13, wherein a color emitted from a light-emitting layer of the one organic EL element is different from colors emitted from light-emitting layers of the other organic EL elements.

15. The organic EL device according to claim 13, wherein the one organic EL element has an electron injection/transport layer, and the other organic EL elements have no electron injection/transport layers.

16. The organic EL device according to claim 13, wherein a material for forming the hole injection/transport layer in the one organic EL element comprises a polythiophene derivative.

17. The organic EL device according to claim 13, wherein the plurality of organic EL elements include organic EL elements for emitting a red light component, organic EL elements for emitting a green light component, and organic EL elements for emitting a blue light component.

* * * * *